United States Patent
Zhang et al.

(10) Patent No.: US 9,625,760 B2
(45) Date of Patent: Apr. 18, 2017

(54) METHOD FOR MANUFACTURING COLOR FILTER SUBSTRATE, COLOR FILTER SUBSTRATE AND DISPLAY DEVICE

(71) Applicants: BOE TECHNOLOGY GROUP CO., LTD., Beijing (CN); BEIJING BOE DISPLAY TECHNOLOGY CO., LTD., Beijing (CN)

(72) Inventors: Jikai Zhang, Beijing (CN); Tonghua Yang, Beijing (CN); Jiyu Wan, Beijing (CN); Dan Wang, Beijing (CN); Gyuhyun Lee, Beijing (CN)

(73) Assignees: BOE TECHNOLOGY GROUP CO., LTD. (CN); BEIJING BOE DISPLAY TECHNOLOGY CO., LTD. (CN)

( * ) Notice: Subject to any disclaimer, the term of this patent is extended or adjusted under 35 U.S.C. 154(b) by 70 days.

(21) Appl. No.: 14/416,658

(22) PCT Filed: Jun. 20, 2014

(86) PCT No.: PCT/CN2014/080392
§ 371 (c)(1),
(2) Date: Jan. 23, 2015

(87) PCT Pub. No.: WO2015/070609
PCT Pub. Date: May 21, 2015

(65) Prior Publication Data
US 2016/0187719 A1    Jun. 30, 2016

(30) Foreign Application Priority Data
Nov. 12, 2013 (CN) .......................... 2013 1 0560154

(51) Int. Cl.
*G02B 5/22*     (2006.01)
*G02B 7/00*     (2006.01)
(Continued)

(52) U.S. Cl.
CPC ......... *G02F 1/133516* (2013.01); *G02B 1/14* (2015.01); *G02B 5/201* (2013.01);
(Continued)

(58) Field of Classification Search
CPC .......... G02B 5/201; G02B 5/223; G02B 1/14; G02F 1/133514; G02F 1/133512;
(Continued)

(56) References Cited

U.S. PATENT DOCUMENTS 5,876,882 A * 3/1999 Yoda ..................... G03F 7/0007
                                                            430/324
6,127,072 A * 10/2000 Shiba ..................... G02B 5/201
                                                            349/106
(Continued)

FOREIGN PATENT DOCUMENTS

CN         1607436 A         4/2005
CN         1881016 A        12/2006
(Continued)

OTHER PUBLICATIONS

Office Action in Chinese Patent Application No. 201310560154.1, dated Jul. 24, 2015.
International Search Report and Written Opinion in PCT International Application No. PCT/CN2014/080392, dated Sep. 24, 2014.
Office Action in Chinese Patent Application No. 201310560154.1, dated Feb. 14, 2106.

*Primary Examiner* — Jade R Chwasz
(74) *Attorney, Agent, or Firm* — Scarinci Hollenbeck (57) ABSTRACT

Provided are method for manufacturing a color filter substrate, color filter substrate and display device. The method includes the following steps: providing a substrate; forming a color pixel unit on the substrate; forming a protective layer on the color pixel unit; coating an alignment film paint and a spacer paint on the protective layer in turn, and forming an alignment film and a spacer via a single patterning process or double patterning processes.

4 Claims, 7 Drawing Sheets

(51) Int. Cl.
- *G02F 1/1335* (2006.01)
- *G02F 1/1339* (2006.01)
- *G02B 1/14* (2015.01)
- *G02B 5/20* (2006.01)
- *G03F 7/00* (2006.01)
- *G02F 1/1337* (2006.01)

(52) U.S. Cl.
CPC .... *G02F 1/13394* (2013.01); *G02F 1/133512* (2013.01); *G03F 7/0007* (2013.01); *G02F 1/1337* (2013.01); *G02F 1/133723* (2013.01)

(58) Field of Classification Search
CPC ........... G02F 1/133516; G02F 1/13394; G02F 2001/133519; G02F 2001/13396; G02F 1/133528; G02F 1/1337; G02F 1/1339; G02F 1/133753; G02F 1/133784; G02F 2001/133
USPC ......................................... 359/885, 891, 892
See application file for complete search history.

(56) References Cited

U.S. PATENT DOCUMENTS

| | | | |
|---|---|---|---|
| 2001/0026347 A1* | 10/2001 | Sawasaki | G02F 1/133707 349/156 |
| 2006/0077335 A1 | 4/2006 | Chen et al. | |

FOREIGN PATENT DOCUMENTS

| | | | | |
|---|---|---|---|---|
| CN | 101566763 A | | 10/2009 | |
| CN | 102466922 A | | 5/2012 | |
| CN | 102628971 A | | 8/2012 | |
| CN | 103558711 A | | 2/2014 | |
| EP | 0 964 289 A1 | | 12/1999 | |
| JP | H07-325298 A | | 12/1995 | |
| JP | H10-73827 A | | 3/1998 | |
| JP | H1073827 | * | 3/1998 | ........... G02F 1/1337 |
| KR | 20020056711 A | | 7/2002 | |
| WO | 2013/050120 A1 | | 4/2013 | |

* cited by examiner

METHOD FOR MANUFACTURING COLOR FILTER SUBSTRATE, COLOR FILTER SUBSTRATE AND DISPLAY DEVICE

CROSS-REFERENCE TO RELATED APPLICATION

The present application is the U.S. national phase of PCT Application No. PCT/CN2014/080392 filed on Jun. 20, 2014, which claims priority to Chinese Patent Application No. 201310560154.1 filed on Nov. 12, 2013, the disclosures of which are incorporated in their entirety by reference herein.

TECHNICAL FIELD

The present disclosure relates to the field of display technology, and in particular, to a method for manufacturing a color filter substrate, a color filter substrate and a display device.

BACKGROUND

Color filter (CF) substrate is a main component of a display device. With a development of color filter substrate technology, reducing production cost and shortening manufacturing time have become a continuous striving direction of industry development.

Figure 1:
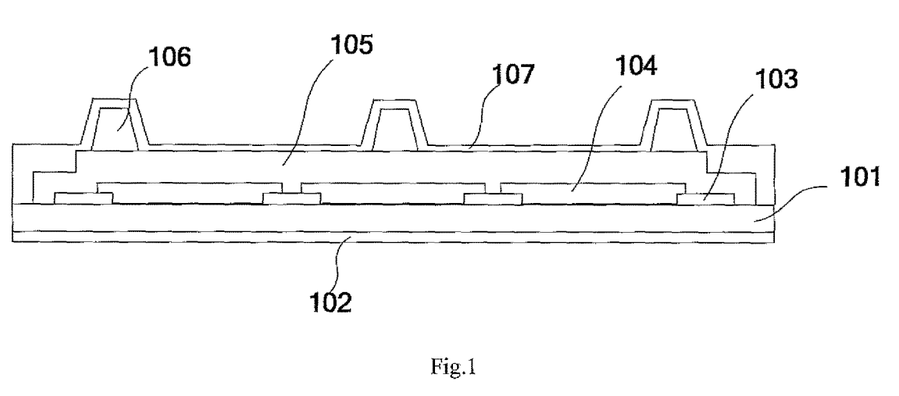
FIG. 1 is a structural representation of a color filter substrate in the prior art.

FIG. 1 is a structural representation of a color filter substrate in the prior art. A method for manufacturing a color filter substrate in the prior art will be illustrated in conjunction with FIG. 1. The method for manufacturing a color filter substrate in the prior art includes the steps below:

Step 1: forming a transparent conducting layer 102 at one side of a substrate 101;

Step 2: forming a black matrix (BM) 103 at the other side of the substrate 101;

Step 3: forming a color pixel unit 104 on the black matrix 103;

Step 4: forming a protective layer (OC) 105 on the color pixel unit 104;

Step 5: forming a columnar spacer (PS) 106 on the protective layer 105; and

Step 6: forming an alignment film (i.e., a PI film, (Polyimide film)) on the columnar spacer 106.

Figure 2:
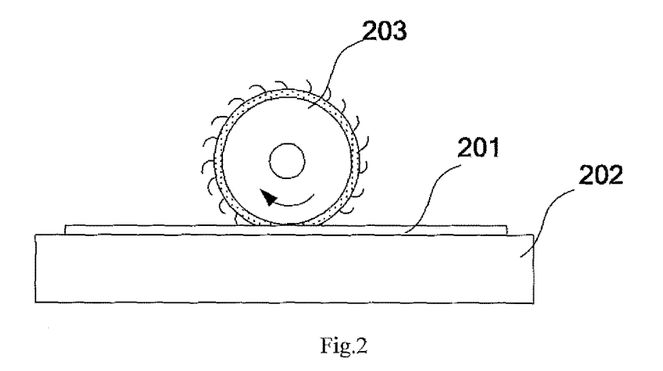
FIG. 2 is a schematic diagram of a rubbing alignment process performed on an alignment film on a color filter substrate during a Cell-stage process of the prior art.

In order to make a major axis of most liquid crystal molecules be arranged along a same direction, a rubbing alignment process further needs to be performed on the alignment film during a Cell-stage process after the alignment film is formed. FIG. 2 is a schematic diagram of a rubbing alignment process performed on an alignment film on a color filter substrate during a Cell-stage process of the prior art, and a commonly-used method is: loading a color filter substrate 201 formed with an alignment film on a substrate table 202; arranging molecules on a surface of the alignment film along a friction direction via a fixed friction roller 203 rotating at a high speed (a rubbing cloth is wrapped around the friction roller 203), thereby reinforcing an interaction force between the molecules of the alignment film and the liquid crystal molecules and affecting an alignment effect of the liquid crystal molecules.

In the above manufacturing method, the color filter substrate formed with the alignment film needs to be transported to the Cell-stage process for rubbing alignment, so as to form an alignment film adaptable for liquid crystal molecule alignment, there exists a problem that a transport equipment is required and the transport time is long. Additionally, the rubbing alignment process on the alignment film during the Cell-stage process is complex, thus the time required for manufacturing the color filter substrate is long, and the cost is high.

SUMMARY

An object of the present disclosure is to provide a method for manufacturing a color filter substrate, a color filter substrate and a display device, thereby the time for manufacturing a color filter substrate may be shortened.

To attain the above object, in a first aspect of embodiments of the present disclosure, there provides a method for manufacturing a color filter substrate, which includes the following steps:

providing a substrate;

forming a color pixel unit on the substrate;

forming a protective layer on the color pixel unit; and coating an alignment film paint and a spacer paint on the protective layer in turn, and forming an alignment film and a spacer via a single patterning process or double patterning processes.

In an example, prior to the step of forming a color pixel unit on the substrate, the method further includes a step of forming a black matrix at one side of the substrate and forming a transparent conducting layer at the other side of the substrate. In an example, the color pixel unit is formed on the black matrix on the substrate.

In an example, the spacer paint is a transparent paint, and the alignment film and the spacer are formed simultaneously via a single patterning process.

In an example, the spacer paint is a nontransparent paint, and the spacer and the alignment film are formed via double patterning processes.

In an example, the step of forming the alignment film and the spacer via double patterning processes further includes:

exposing and developing the substrate coated with the spacer paint to form the spacer; and exposing and developing the substrate formed with the spacer to form the alignment film.

In an example, the alignment film paint is a polyimide liquid crystal alignment agent added with polyacrylic acid.

In an example, subsequent to the step of coating an alignment film paint on the protective layer, the method further includes a step of pre-thermocuring the alignment film paint.

In another aspect of embodiments of the present disclosure, there provides a color filter substrate, which is manufactured by the above method.

In still another aspect of embodiments of the present disclosure, there provides a display device, which includes the above color filter substrate.

As being different from the manufacturing method of the prior art in which a protective layer is first formed and then an alignment film is formed, in the method for manufacturing a color filter substrate according to the embodiments of the present disclosure, an alignment film paint is coated first, then a spacer paint is coated, and an alignment film and a spacer is formed via a single patterning process or double patterning processes; as a result, there is no need to transport a color filter substrate to the Cell-stage process for rubbing alignment, thereby the transport equipment and the transport time may be saved, the production process may be simplified, the manufacturing time required may be shortened, and the manufacturing cost may be reduced.

DETAILED DESCRIPTION

In the prior art, a color filter substrate formed with an alignment film needs to be transported to a Cell-stage process for rubbing alignment so as to align molecules of the alignment film, as a result, there rises a problem that the process is complex, the time required for manufacturing a color filter substrate is long and the cost is high. Directing to such problem, in the process for manufacturing a color filter substrate according to the first aspect of embodiments of the present disclosure, after a protective layer is formed, an alignment film paint is coated first, then a spacer paint is coated, and an alignment film and a spacer are formed via a single patterning process or double patterning processes, instead of forming a spacer firstly and then forming an alignment film, thus there is no need to transport a color filter substrate the Cell-stage process for rubbing alignment, the transport equipment and the transport time may be saved, the production process may be simplified, the manufacturing time required may be shortened, and the manufacturing cost may be reduced.

The technical solutions of the present disclosure will be described in detail below in conjunction with the drawings and embodiments of the present disclosure. The embodiments below are used for illustrating the present disclosure, rather than limiting the scope of the present disclosure.

Figure 3:
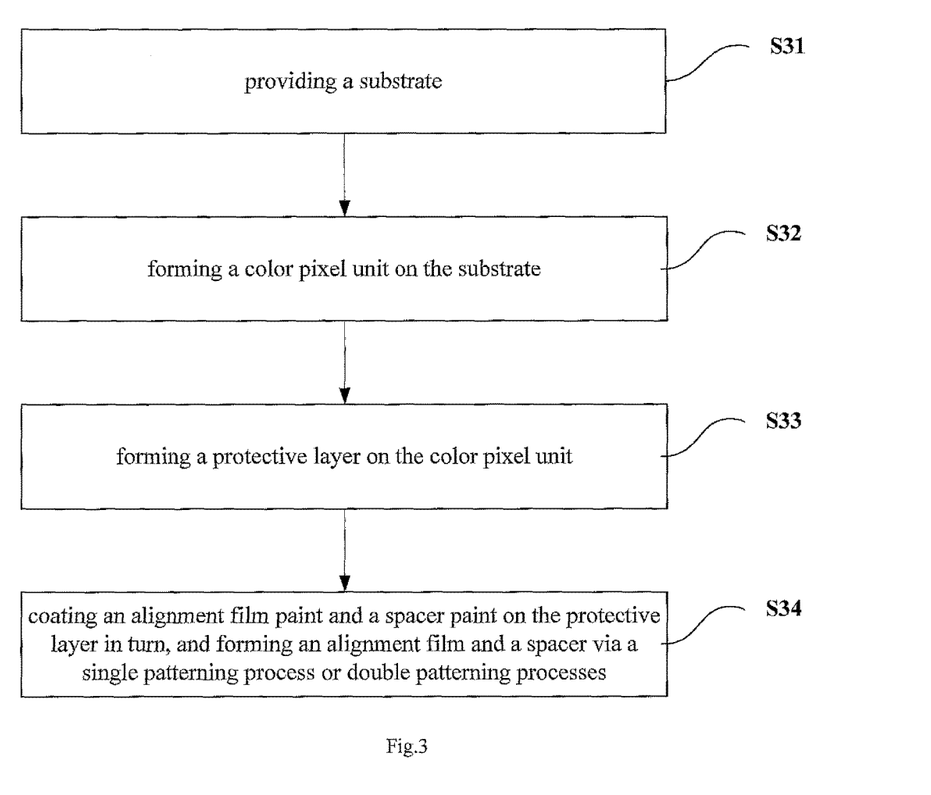
FIG. 3 is a schematic flow chart of a method for manufacturing a color filter substrate according to Embodiment 1 of the present disclosure.

FIG. 3 is a schematic flow chart of a method for manufacturing a color filter substrate according to Embodiment 1 of the present disclosure, which includes the following steps:

Step S31: providing a substrate;

Step S32: forming a color pixel unit on the substrate;

Step S33: forming a protective layer on the color pixel unit; and

Step S34: coating an alignment film paint and a spacer paint on the protective layer in turn, and forming an alignment film and a spacer via a single patterning process or double patterning processes.

By the method according to the above embodiment, when manufacturing a color filter substrate, a process for manufacturing an alignment film and a process for manufacturing a spacer are combined, and the alignment film and the spacer are fowled via a single patterning process or via double patterning processes, so that there is no need to transport the color filter substrate to a Cell-stage process for rubbing alignment, thus the transport equipment and the transport time may be saved, the production process may be simplified, the manufacturing time required may be shortened, and the manufacturing cost may be reduced.

In an example, when the spacer paint is a transparent paint, the alignment film and the spacer may be formed simultaneously via a single patterning process. In an example, when the spacer paint is a nontransparent paint, the alignment film and the spacer may be formed via double patterning processes.

The step of forming the alignment film and the spacer simultaneously via a single patterning process may specifically include: exposing and developing the substrate coated with the alignment film paint and the spacer paint, to form the alignment film and the spacer simultaneously.

The solution of the single patterning process is illustrated below in an example.

Figure 4:
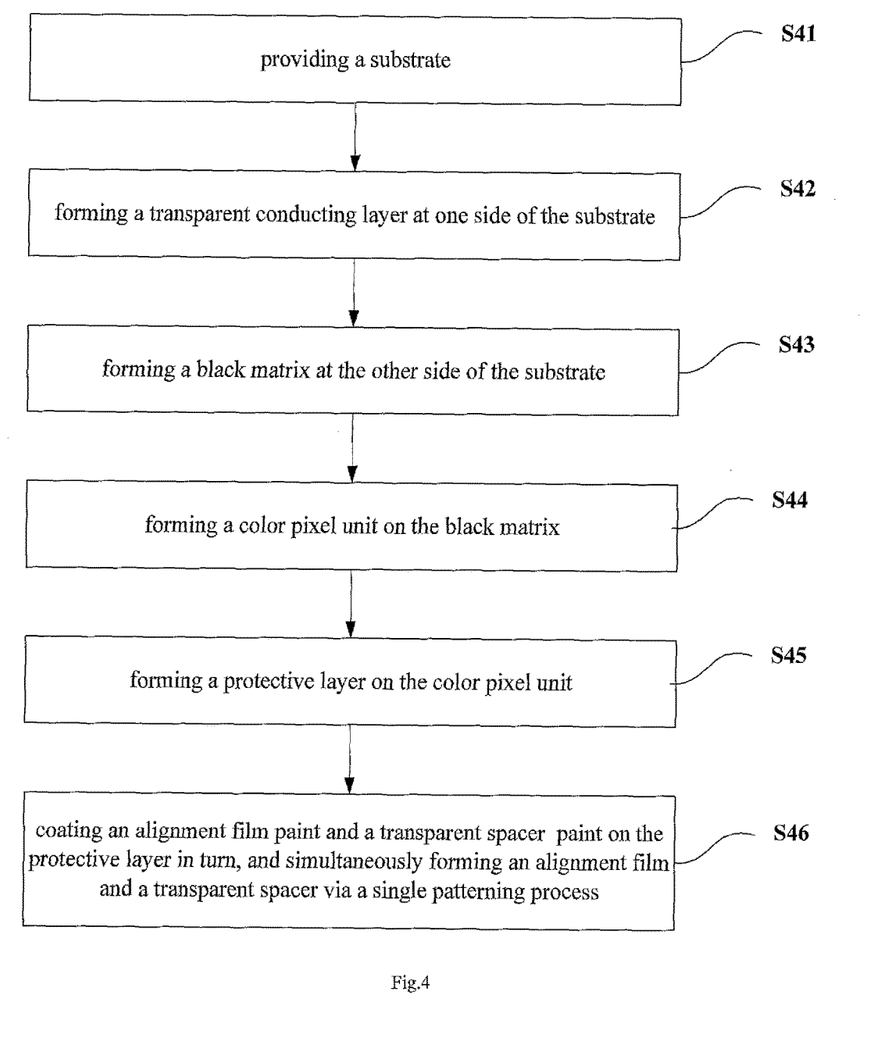
FIG. 4 is a schematic flow chart of a method for manufacturing a color filter substrate according to Embodiment 2 of the present disclosure.

FIG. 4 is a schematic flow chart of a method for manufacturing a color filter substrate according to Embodiment 2 of the present disclosure, which includes the following steps:

Step S41: providing a substrate, which may be a glass substrate or a substrate of other transparent materials;

Step S42: forming a transparent conducting layer at one side of the substrate, in which the transparent conducting layer may be made of tin indium oxide (ITO) or other transparent conducting materials;

Step S43: forming a black matrix at the other side of the substrate;

Step S44: forming a color pixel unit on the black matrix, in which the color pixel unit may include three sub-pixel units, for example, three sub-pixel units of red/green/blue (R/G/B), certainly, the color pixel unit may also have other structures;

Step S45: forming a protective layer on the color pixel unit; and

Step S46: coating an alignment film paint and a transparent spacer paint on the protective layer in turn, and simultaneously forming an alignment film and a transparent spacer via a single patterning process.

It should be noted that, in the embodiment of the disclosure, an order for forming respective layers of the color filter substrate is not limited to the order of the above steps, for example, in some embodiments, a transparent conducting layer may be firstly formed at one side of the substrate, and then a black matrix and the like, may be formed at the other side of the substrate; or a black matrix and the like, may be firstly formed at one side of the substrate, and then a transparent conducting layer may be formed at the other side of the substrate.

In the above embodiment, subsequent to the step of coating the alignment film paint, the method may further include a step of pre-thermocuring the alignment film paint, so as to enhance an adhesion of the alignment film paint. The process of pre-thermocuring the alignment film may be a commonly-used method in the art.

In the above Step S46, the single patterning process may be performed on the substrate coated with the alignment film paint and the transparent spacer paint by different means, so that the alignment film and the transparent spacer may be formed simultaneously. Illustrations are given below in an example.

Figure 5:
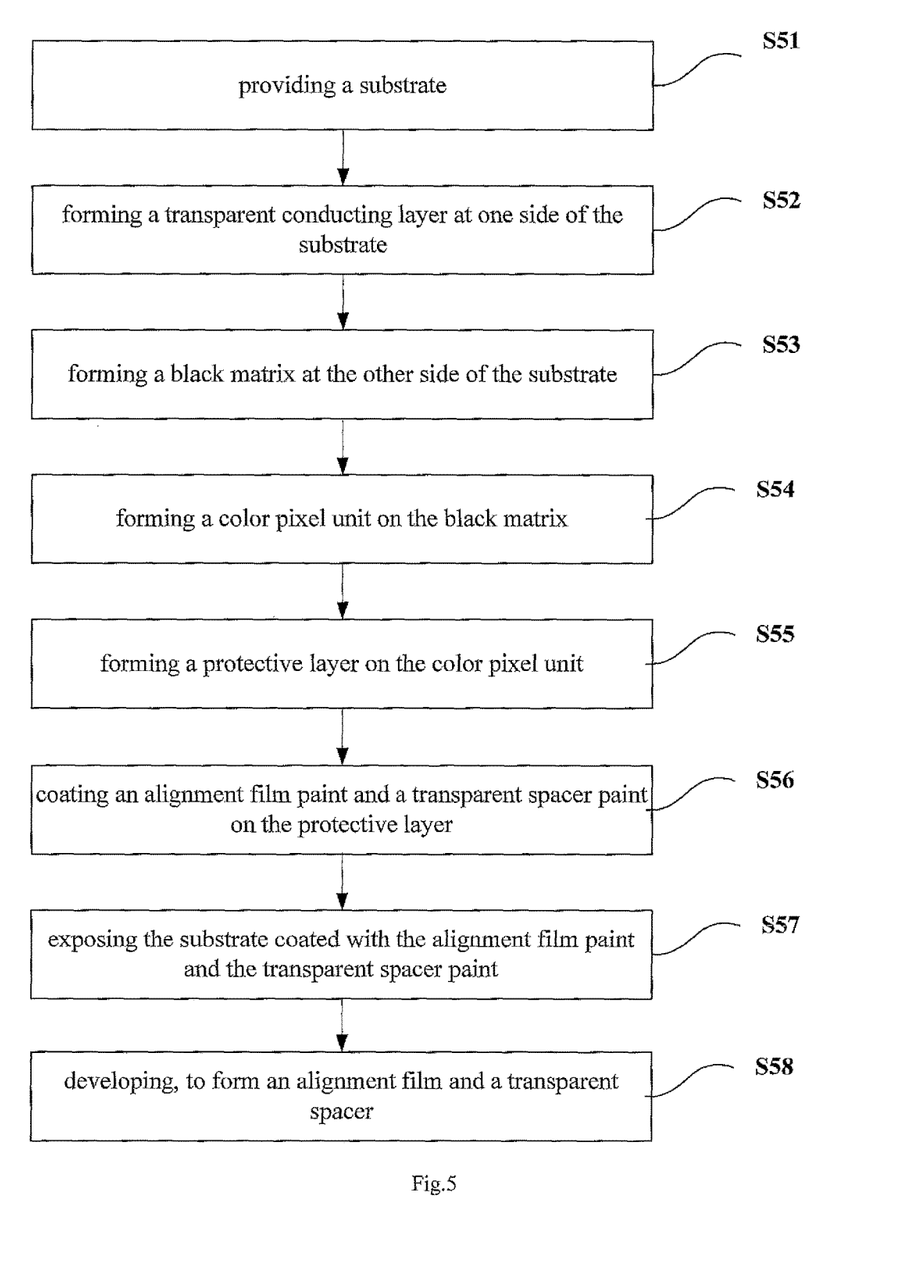
FIG. 5 is a schematic flow chart of a method for manufacturing a color filter substrate according to Embodiment 3 of the present disclosure.

FIG. 5 is a schematic flow chart of a method for manufacturing a color filter substrate according to Embodiment 3 of the present disclosure, which includes the following steps:

Step S51: providing a substrate;

Step S52: forming a transparent conducting layer at one side of the substrate;

Step S53: forming a black matrix at the other side of the substrate;

Step S54: forming a color pixel unit on the black matrix;

Step S55: forming a protective layer on the color pixel unit;

Step S56: coating an alignment film paint and a transparent spacer paint on the protective layer in turn, in which the transparent spacer paint is a photosensitive paint, in an example, the transparent spacer paint may be positive photoresist; and Step S57: exposing the substrate coated with the alignment film paint and the transparent spacer paint; in one example, a mask plate may be used in exposing the alignment film paint and the transparent spacer paint from a side far from the transparent spacer paint, and in an example, the exposing step may be performed under ultraviolet (UV) lights.

The alignment film paint may be a polyimide liquid crystal alignment agent added with polyacrylic acid (PAA), as PAA is a dispersing agent, it has a characteristic of aligning liquid crystal molecules after being exposed.

In an example, the transmittance of the transparent spacer paint usually can reach about 87%, thus an irradiation intensity received by the alignment film paint will not be influenced.

Step S58: developing, to form an alignment film and a transparent spacer.

In an example, the transparent spacer is a columnar spacer; correspondingly, there is a shelter having a shape matching to that of the transparent spacer at a position of the mask plate corresponding to the transparent spacer.

Figure 6:
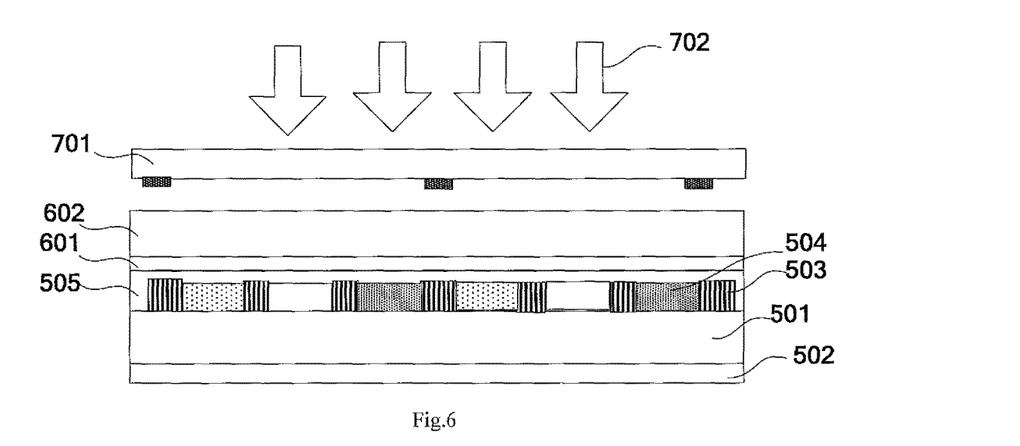
FIG. 6 is a schematic diagram of an exposing process according to an embodiment of the present disclosure.

FIG. 6 is a schematic diagram of an exposing process according to an embodiment of the present disclosure.

During the process for manufacturing the color filter substrate in FIG. 6, first of all, a transparent conducting layer 502, a black matrix 503, a color pixel unit 504 and a protective layer 505 are respectively formed on a substrate 501 according to Steps S51-S55, and then an alignment film paint 601 and a transparent spacer paint 602 are coated in turn according to Step S56. Finally, the alignment film paint 601 and the transparent spacer paint 602 are exposed via a mask plate 701 from a side far from the transparent spacer paint, and 702 in the drawing refers to the ultraviolet lights required in the exposing process.

Figure 7:
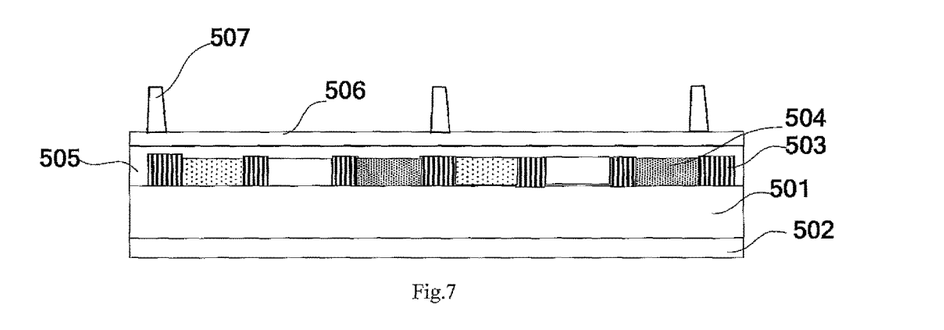
FIG. 7 is a structural representation of a color filter substrate after being developed according to an embodiment of the present disclosure.

FIG. 7 is a structural representation of a color filter substrate after developing according to an embodiment of the present disclosure. In FIG. 7, 506 and 507 respectively refer to the alignment film and the transparent spacer formed simultaneously.

By the method according to the above embodiment, an alignment film and a transparent spacer may be formed simultaneously via a single exposing and developing process, so that there is no need to transport the color filter substrate to a Cell-stage process, thus the transport equipment and the transport time may be saved, the production process may be simplified, the manufacturing time required may be shortened, and the manufacturing cost may be reduced.

In the above embodiment, the transparent spacer paint is a photosensitive paint, thus during manufacturing the alignment film and the transparent spacer, exposing and developing are only required to be performed in the process, and steps of coating a photoresist and removing the photoresist are not required. Certainly, the transparent spacer paint may also be a non-photosensitive paint; and at this time, in addition to exposing and developing, the steps of coating a photoresist and removing the photoresist is further required in the process.

Figure 8:
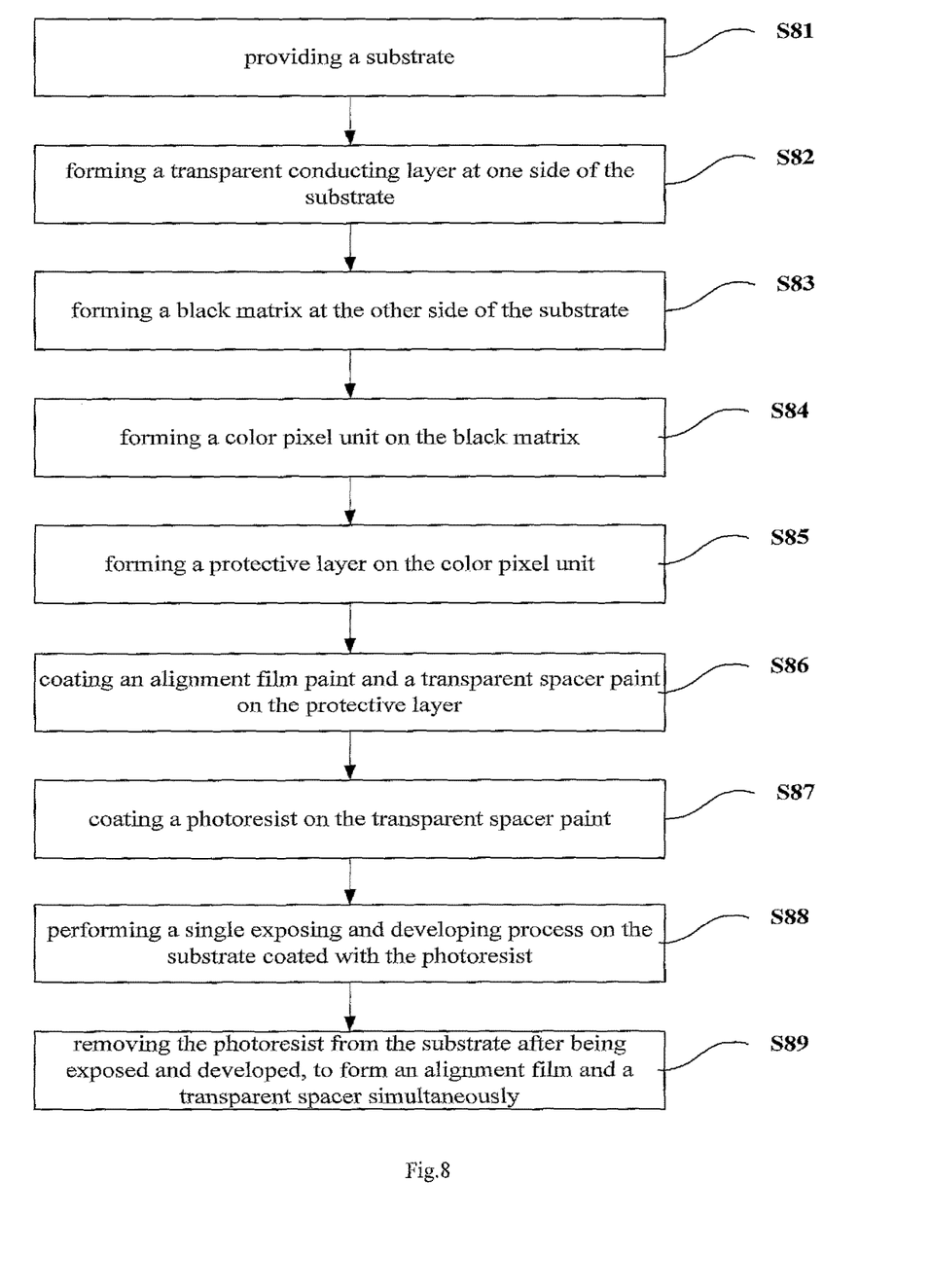
FIG. 8 is a schematic flow chart of a method for manufacturing a color filter substrate according to Embodiment 4 of the present disclosure.

FIG. 8 is a schematic flow chart of a method for manufacturing a color filter substrate according to Embodiment 4 of the present disclosure, which includes the following steps:

Step S81: providing a substrate;

Step S82: forming a transparent conducting layer at one side of the substrate;

Step S83: forming a black matrix at the other side of the substrate;

Step S84: forming a color pixel unit on the black matrix;

Step S85: forming a protective layer on the color pixel unit;

Step S86: coating an alignment film paint and a transparent spacer paint on the protective layer in turn;

Step S87: coating a photoresist on the transparent spacer paint;

Step S88: performing a single exposing and developing process on the substrate coated with the photoresist; and Step S89: removing the photoresist from the substrate after being exposed and developed, and forming an alignment film and a transparent spacer simultaneously.

It should be noted that, the process of forming an alignment film and a spacer via double patterning processes may specifically include the following steps:

exposing and developing the substrate coated with the spacer paint to form the spacer; and exposing and developing the substrate formed with the spacer to form the alignment film.

When the spacer paint is a photosensitive paint, the substrate coated with the spacer paint may be exposed and developed directly, to form the spacer; then, the substrate formed with the spacer may be exposed and developed again, to form the alignment film.

When the spacer paint is a non-photosensitive paint, a photoresist may be coated on the spacer paint, and the substrate coated with the photoresist may be exposed and developed firstly, and then the photoresist may be removed from the substrate after being exposed and developed, to form the spacer; then, the substrate formed with the spacer may be exposed and developed again, to form the alignment film.

Additionally, it should be noted that, the substrate, the transparent conducting layer, the black matrix, the color pixel unit, the protective layer and the like according to embodiments of the present disclosure, may be formed using materials well-known in the art and by methods well-known in the art. The alignment film paint, the transparent spacer paint, the photoresist, the mask and the like, as well as the methods for applying or removing the same may use materials well-known in the art by methods well-known in the art. Moreover, the exposing and developing process in embodiments of the present disclosure may also be performed by methods well-known in the art.

In another aspect of embodiments of the disclosure, there further provides a color filter substrate, which includes:

a substrate;

a color pixel unit formed on the substrate;

a protective layer formed on the color pixel unit;

an alignment film formed on the protective layer; and a spacer formed on the alignment film, in which the alignment film and the spacer are formed via a single patterning process or double patterning processes.

Figure 9:
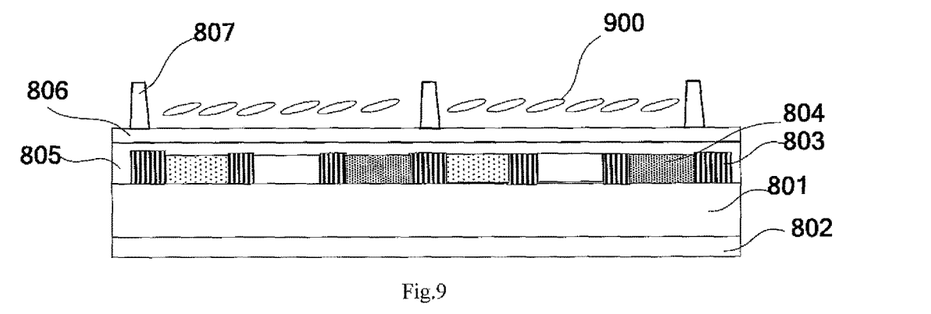
FIG. 9 is a structural representation of a color filter substrate according to Embodiment 5 of the present disclosure.

FIG. 9 is a structural representation of a color filter substrate according to Embodiment 5 of the present disclosure, manufactured by the method according to any one of the above embodiments, which includes:

a substrate 801, which may be a glass substrate or a substrate of other transparent materials;

a black matrix 802 formed at one side of the substrate 801;

a transparent conducting layer 803 formed at the other side of the substrate 801, the transparent conducting layer 803 may be made of a tin indium oxide material or other transparent conducting materials;

a color pixel unit 804 formed on the black matrix 802, the color pixel unit 804 may include three sub-pixel units, for example, three sub-pixel units of red/green/blue (R/G/B), certainly, the color pixel unit may also have other structures;

a protective layer 805 formed on the color pixel unit 804;

an alignment film 806 formed on the protective layer 805; and a spacer 807 formed on the alignment film 806.

In FIG. 8, 900 refers to liquid crystal molecules.

The alignment film 806 and the spacer 807 are formed by performing a single patterning process or double patterning processes on a substrate coated with an alignment film paint and a spacer paint in turn.

In an example, when the spacer paint is a transparent paint, the alignment film and the spacer may be formed simultaneously via a single patterning process. When the spacer paint is a nontransparent paint, the alignment film and the spacer may be formed via double patterning processes.

The process of foaming the alignment film and the spacer simultaneously via a single patterning process may specifically include: exposing and developing the substrate coated with the alignment film paint and the spacer paint, to form an alignment film and a spacer simultaneously.

When the spacer paint is a photosensitive paint, the process of performing a single patterning process on the substrate coated with the alignment film paint and the spacer paint in turn may include: exposing and developing the substrate coated with the alignment film paint and the spacer paint, to form the alignment film and the spacer.

When the spacer paint is a non-photosensitive paint, the process of performing a single patterning process on the substrate coated with the alignment film paint and the spacer paint in turn may also include: coating a photoresist on the spacer paint; exposing and developing the substrate coated with the photoresist; removing the photoresist from the substrate after being exposed and developed, to form the alignment film and the spacer simultaneously.

The process of forming the alignment film and the spacer via double patterning processes may specifically include: exposing and developing the substrate coated with the spacer paint to form the spacer; and exposing and developing the substrate formed with the spacer to form the alignment film.

When the spacer paint is a photosensitive paint, the substrate coated with the spacer paint may be exposed and developed directly, to form the spacer; and then, the substrate formed with the spacer may be exposed and developed again, to form the alignment film.

When the spacer paint is a non-photosensitive paint, a photoresist may be coated on the spacer paint, and the substrate coated with the photoresist may be exposed and developed firstly, and then the photoresist may be removed from the substrate after being exposed and developed to form the spacer; and then, the substrate formed with the spacer may be exposed and developed again, to form the alignment film.

In another aspect of embodiments of the present disclosure, there provides a display device, which includes the above color filter substrate. The display device may be any product or component that has a display function, for example, a liquid crystal display panel, an electronic paper, an OLED panel, a mobile phone, a tablet computer, a TV set, a display, a notebook computer, a digital photo frame and a navigator, and the like.

The above descriptions show some preferred embodiments of the present disclosure. It should be pointed out that, for one of ordinary skills in the art, various improvements and modifications may be made without departing from the principles of the present disclosure, and these improvements and modifications should be construed as pertaining the protection scope of the present disclosure.

What is claimed is:

1. A method for manufacturing a color filter substrate, comprising the following steps:
   providing a substrate;
   forming a color pixel unit on the substrate;
   forming a protective layer on the color pixel unit; and
   coating an alignment film paint and a spacer paint on the protective layer in turn, and forming an alignment film and a spacer simultaneously via a single patterning process,
   wherein subsequent to the step of coating an alignment film paint on the protective layer, the method further comprises a step of pre-thermocuring the alignment film paint,
   the spacer paint is a non-photosensitive paint, and
   the single patterning process comprises:
   coating a photoresist on the spacer paint; exposing and developing the substrate coated with the photoresist; removing the photoresist from the substrate after being exposed and developed, to form the alignment film and the spacer simultaneously.

2. The method according to claim 1, wherein
   prior to the step of forming a color pixel unit on the substrate, the method further comprises a step of forming a black matrix at one side of the substrate and forming a transparent conducting layer at the other side of the substrate;
   wherein the color pixel unit is formed on the black matrix on the substrate.

3. The method according to claim 1, wherein the spacer paint is a transparent paint.

4. The method according to claim 1, wherein the alignment film paint is a polyimide liquid crystal alignment agent added with polyacrylic acid.

* * * * *